United States Patent [19]

Sporck

[11] Patent Number: 5,670,892
[45] Date of Patent: Sep. 23, 1997

[54] APPARATUS AND METHOD FOR MEASURING QUIESCENT CURRENT UTILIZING TIMESET SWITCHING

[75] Inventor: Nicholas Sporck, Saratoga, Calif.

[73] Assignee: LSI Logic Corporation, Milpitas, Calif.

[21] Appl. No.: 545,880

[22] Filed: Oct. 20, 1995

[51] Int. Cl.[6] ................................................. G01R 31/06
[52] U.S. Cl. ............................................ 324/765; 324/158.1
[58] Field of Search ........................... 324/158.1, 73.1, 324/500, 537, 765, 755; 437/8; 371/15.1, 22.1, 22.2, 22.6, 25.1

[56] References Cited

U.S. PATENT DOCUMENTS

| | | | |
|---|---|---|---|
| 4,631,724 | 12/1986 | Shimizu | 365/201 |
| 4,637,020 | 1/1987 | Schinabeck | 371/20.4 |
| 5,025,344 | 6/1991 | Maly et al. | 371/22.5 |
| 5,057,774 | 10/1991 | Verhelst et al. | 371/22.5 |
| 5,332,973 | 7/1994 | Brown et al. | 324/537 |
| 5,371,457 | 12/1994 | Lipp | 324/158.1 |

*Primary Examiner*—Vinh P. Nguyen
*Attorney, Agent, or Firm*—Matthew G. Reeves

[57] ABSTRACT

A process is provided for use with a semiconductor testing apparatus having a vector generator which provides a sequence of vectors to a semiconductor device at a rate responsive to a timeset, a power supply which provides current to the semiconductor device and a current monitor which measures the current provided to the device. In one specific embodiment, the process includes setting the timeset to a first rate, conditioning the device by executing a plurality of vectors at the first rate, setting the timeset to a second rate, the second rate being slower than the first rate, and measuring the quiescent current while the timeset is set to the second rate.

6 Claims, 3 Drawing Sheets

APPARATUS AND METHOD FOR MEASURING QUIESCENT CURRENT UTILIZING TIMESET SWITCHING

BACKGROUND OF THE INVENTION

This invention relates to the field testing of semiconductor devices, and more particularly, to a method for testing circuits by measuring a quiescent current, and still more particularly, to a method for testing high performance CMOS devices by applying timeset switching techniques to quiescent current measurements.

Electronic circuits, particularly semiconductor devices, or integrated circuits, are susceptible to a wide variety of defects at all stages of their manufacture. Therefore, before integrated circuits may be shipped to the consumer, they must be thoroughly tested to insure that they function properly in all aspects. However, such testing presents a number of challenges because the integrated circuit itself is made up of thousands of transistors, each of which may be conditioned in either an "on" state or an "off" state. Ideally, each transistor in the device is tested in each state. Of course, in even a marginally complicated device, the number of states to be tested may be well over a million.

One type of testing used in the art is known as "functional testing". In this type of testing, a number of test patterns, known as vectors, are applied to the input of the device to be tested, and the resulting outputs from the device are recorded. Since the output patterns that correspond to specific input vectors are known, the recorded outputs may be compared with the corresponding input to determine whether the device is operating properly.

Automatic Test Equipment ("ATE") systems are known in the art which perform functional testing. Examples of such ATE systems are the STS6120, Vista LT, Vista Logic and SC212 manufactured by Credence Systems Corporation. However, other suitable ATE systems will occur to those of skill in the art. Generally, a vector pattern, i.e., a series of individual vectors to be provided to the inputs of the device to be tested, are programmed into the ATE along with the expected output corresponding to each of the vectors. A device to be tested is then connected to the ATE and the functional test is then run.

However, not all defects are detectable by functional testing. For example, the device may contain local partial shorts, or open circuits, which would still cause the device to provide the proper output in response to a given vector even though the device is actually defective. Therefore, other types of tests are also required to detect these defects. One such method for testing is known as quiescent current testing. Quiescent current testing is particularly useful with high performance CMOS devices. An example of this technique is described in U.S. Pat. No. 5,057,744 to Verhelst, et al., incorporated herein by reference. In this type of testing, the device to be tested is conditioned to a given state by providing a vector, or a series of vectors, to the device inputs. Of course, in a normal device when the vector is first provided, the supply current rises to an initially high transient value and eventually settles down to a quiescent value. Generally, the quiescent current is only a few microamps at most. However, a defective device may draw as much as two milliamps of supply current. The quiescent current is then measured to determine whether it falls in an acceptable range. If not, the device is considered defective and may be appropriately disposed of.

Of course, since it is desirable to test all of the transistors in the device, numerous vectors must be provided to the device, and the quiescent current determined for each one. This involves providing a vector pattern to the device.

It is useful to use the same vector pattern for quiescent current testing as used with functional testing. However, not every vector used in the functional testing will have a quiescent current measurement associated with it. For example, in a vector pattern of 50,000 vectors, it may be that only twenty of the vectors will be used to condition the device for quiescent current measurement.

Of course, with current technology, more time is required to measure the quiescent current than to perform the functional test of providing a vector and checking for a resulting output. For example, for functional testing, vectors are provided to the device at a rate of about one microsecond per vector, while quiescent current measurement requires about 5-10 milliseconds per vector. Therefore, providing the vector pattern to the device at a rate slow enough to allow for current measurement dramatically increases the time required to test each device. Accordingly, it is an object of the present invention to overcome these and other problems in the art.

SUMMARY OF THE INVENTION

According to the present invention, an apparatus is provided for use in the quiescent current testing of integrated circuits. In one embodiment, the apparatus comprises a power supply which provides a quiescent current to the circuit, a vector storage device which stores a vector pattern, a vector generator which sequentially selects individual vectors from the stored vector pattern and provides the selected vectors to inputs of the circuit, a timeset switching circuit responsive to the selected vector, which sets a rate at which the vector generator provides the selected vectors to the circuit, a current monitoring device which measures the quiescent current provided to the circuit, and compares the measured current with a reference current level.

According to another embodiment of the invention, a process is provided for testing semiconductor circuits using quiescent current measurements. In one aspect, the process comprises setting a timeset to a first rate, executing a plurality of vectors at the first rate whereby a predetermined state of the circuit is achieved, setting the timeset to a second rate, the second rate being slower than the first rate, measuring the quiescent current of the circuit while the timeset is set to the second rate, and generating a circuit acceptance signal responsive to the difference between the quiescent current and a pre-determined acceptable quiescent current level.

BRIEF DESCRIPTION OF THE DRAWINGS

For a more complete understanding of the invention and for further advantages thereof, reference is made to the following detailed description taken in conjunction with the accompanying drawings, in which.

It is to be noted, however, that the appended drawings illustrate only typical embodiments of this invention, and are therefore not to be considered limited of its scope, for the invention may admit to other equally effective embodiments.

DETAILED DESCRIPTION OF EMBODIMENTS OF THE INVENTION

Figure 1:
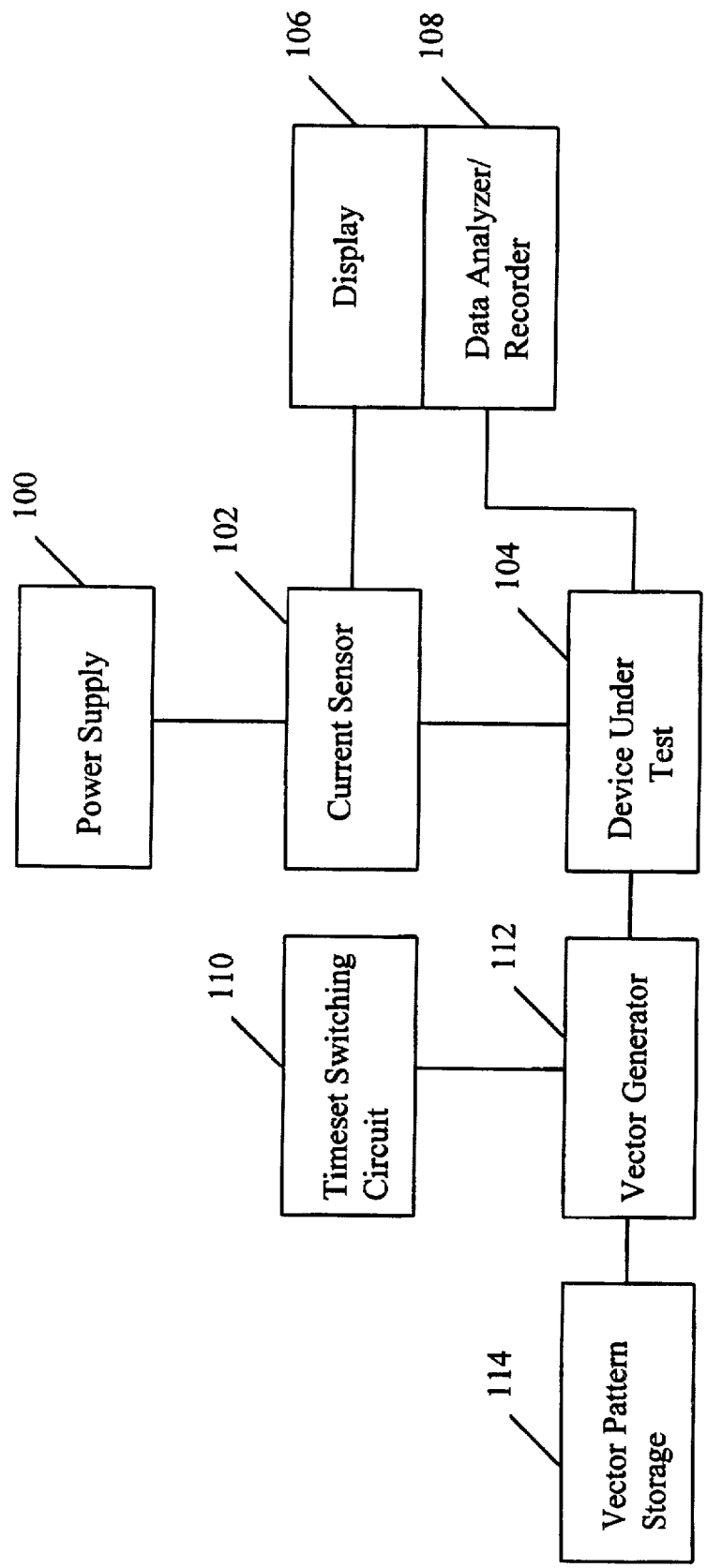
FIG. 1 is a block diagram of an apparatus according to the present invention.

Referring now to FIG. 1, there is shown a block diagram of an apparatus according to an embodiment of the invention. In this embodiment, there is provided a power supply 100 which supplies operating current ("IDD") to a device under test 104. The amount of current being supplied to device 104 is sensed by current sensor 102. Current sensor 102 provides information concerning the current level being supplied to the device 104 to display 106 and/or a data analyzer 108 which provides an operator of the apparatus with an indication of the amount of current being drawn by device 104. A vector storage device 114 stores a vector pattern consisting of a plurality of individual vectors to be sequentially provided to the device 104. Various types of vector storage devices are known in the art. For example, in one embodiment the vector storage device 114 may comprise magnetic memory, such as a floppy disk, or hard disk drive. This allows a user of the apparatus to program the desired vector pattern into the apparatus before beginning the test. Of course, other types of memories are also known to be useful with the vector storage device 114, such as random access memory, or read only memory.

A vector generator 112 sequentially selects individual vectors from the vector pattern stored in the vector storage device 114 and provides the selected vectors to the device 104. In one aspect of the invention, the rate at which the vector generator 112 supplies individual vectors to the device 104 is controlled by the timeset switching circuit 110. The timeset switching circuit 110 is programmable such that the vector generator 112 is operated at different rates as it sequences through a vector pattern. This is known as "timeset switching." For example, timeset switching circuit 110 is initially set such that the apparatus begins operation at a first rate of about one microsecond per vector. After a number of vectors have been executed, or provided to the device 104, the device is conditioned into a predetermined state. By conditioning, it is meant that each transistor in device 104 is in the desired on or off state for a quiescent current testing. Once the device has been conditioned, the timeset switching circuit 110 is then programmed to switch the vector generator 112 to a second rate, for example, five milliseconds per vector.

While the vector generator 112 is operating at the slower, second rate, the device 104 remains conditioned at a particular vector long enough for an accurate measurement of the quiescent current ("IDDQ") provided by power supply 100 to be made. In one aspect, the result of the IDDQ current measurement is provided to display 106 which indicates to an operator how much current is being supplied to device 104. Of course, display 106 is not critical and many types of displays may be used. For example, in one embodiment, the display is a simple CRT which provides a visual output to an operator. In another aspect, display 106 comprises a memory (not shown) which stores the results from current sensor 102 for later review by an operator.

In still another aspect, the results from the current sensor 102 are provided to a Data Analyzer which compares the measurement received from current sensor 102 to a reference current level to determine whether device 104 is defective. Numerous suitable techniques for comparing the quiescent current to a reference current level will occur to those of skill in the art. For example, the difference between the quiescent current as measured and the reference level is abstained in one embodiment. In still a further aspect, if device 104 is defective, then it may be automatically disposed of by the apparatus without any operator involvement.

After the current measurement is made by current sensor 102 and the device is determined to be acceptable, timeset switching circuit 110 resets vector generator 112 to operate, again, at the first, higher rate. The apparatus then operates at the first rate until, once again, the vector generator 112 selects a vector from the vector pattern which will be used in a quiescent current IDDQ measurement.

According to another aspect of the invention, a process is provided for testing semiconductor circuits using quiescent current. In one embodiment, the process comprises setting a timeset to a first rate, executing a plurality of vectors at the first rate whereby a predetermined state of the circuit is achieved, setting the timeset to a second rate, the second rate being slower than the first rate, measuring the quiescent current while the timeset is set to the slower rate, generating a circuit acceptance signal responsive to the difference between the quiescent current and a predetermined quiescent level.

It is to be understood that generating the circuit acceptance signal is not critical and numerous suitable embodiments will occur to those of skill in the art. For example, in one embodiment, the measured quiescent current supplied to the device is compared to an acceptable quiescent current range for a good device. If the measured quiescent current falls outside this range, then the device is considered defective and is disposed of. It is understood that the acceptable range will depend on the parameters of the specific device being tested.

Of course, those of skill in the art will recognize many techniques for comparing the quiescent current can be used. For example, the quiescent current may be subtracted from a reference current. In another aspect, the quiescent current may be converted to a voltage, and this voltage compared to an acceptable voltage range. In still another aspect, the measured quiescent current can be input to an analog to digital converter, and a digital value corresponding to the quiescent current can be compared to an acceptable range of current. This process is described in greater detail with respect to FIG. 2.

Figure 2:
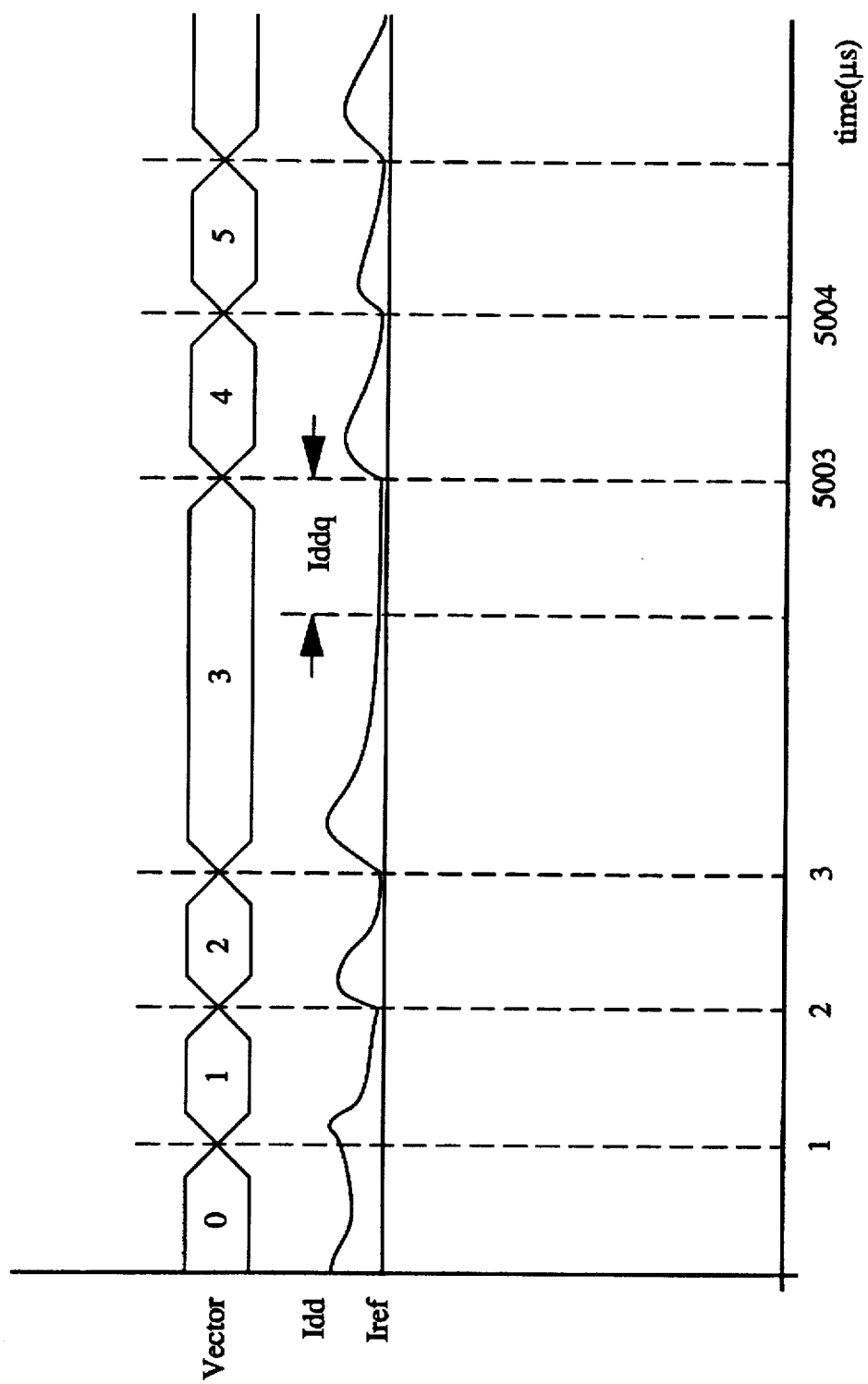
FIG. 2 is a graph showing the quiescent current in relation to the vector pattern according to an embodiment of the invention.

FIG. 2 is a graph showing the supply current IDD to the device being tested as the vector pattern is provided to the device. The timeset is originally set at one microsecond. In other words, a different vector is selected from the vector pattern and provided to the device under test every microsecond. As shown, vectors 1 and 2 are provided at this rate. The current IDD is initially high during the transition between vectors and begins to settle down after the transition is complete. However, since the vectors are being switched at such a high rate, the supply current IDD never has time to completely settle down to a quiescent value.

Vectors 1 and 2 condition the device into a state such that, when vector 3 is applied, it is desired to determine the quiescent current being supplied to the device. Therefore, when vector 3 is applied, the timeset is switched from 1 microsecond to 5,000 microseconds in order to provide enough time for the supply current IDD to settle down to a quiescent state and a current measurement to be made. After the current measurement is made, the timeset is switched back to one microsecond to allow rapid functional testing and/or conditioning of the device until the next vector associated with a current measurement is reached.

The advantage of the present invention is seen in the following example in which 20 IDDQ measurements are to be made from a vector pattern of 50,000 vectors. The IDDQ measurements are acquired at a rate of 50 microseconds per measurement. The conditioning vectors are run at one microsecond per vector. Therefore the total test time equals (50,000–20 vectors)×(1 microsecond)+(20 vectors)×(50 microseconds)=0.0501 seconds. By contrast, if all 50,000 vectors will run at 50 microseconds per vector, the time required would be 2.5 seconds. This represents a 50 fold increase in the speed at which IDDQ measurements are made.

Of course, the above example is only one specific embodiment. Generally, the timeset for running conditioning vectors is between about 100 and about 0.01 microseconds per vector or about 10 $KH_z$ to about 100 $MH_z$. The timeset required for the IDDQ measurement vectors is, for example between about 10 and about 1000 microseconds.

After the quiescent current IDDQ has been measured, it is compared with a reference value to determine whether the device is defective.

Figure 3:
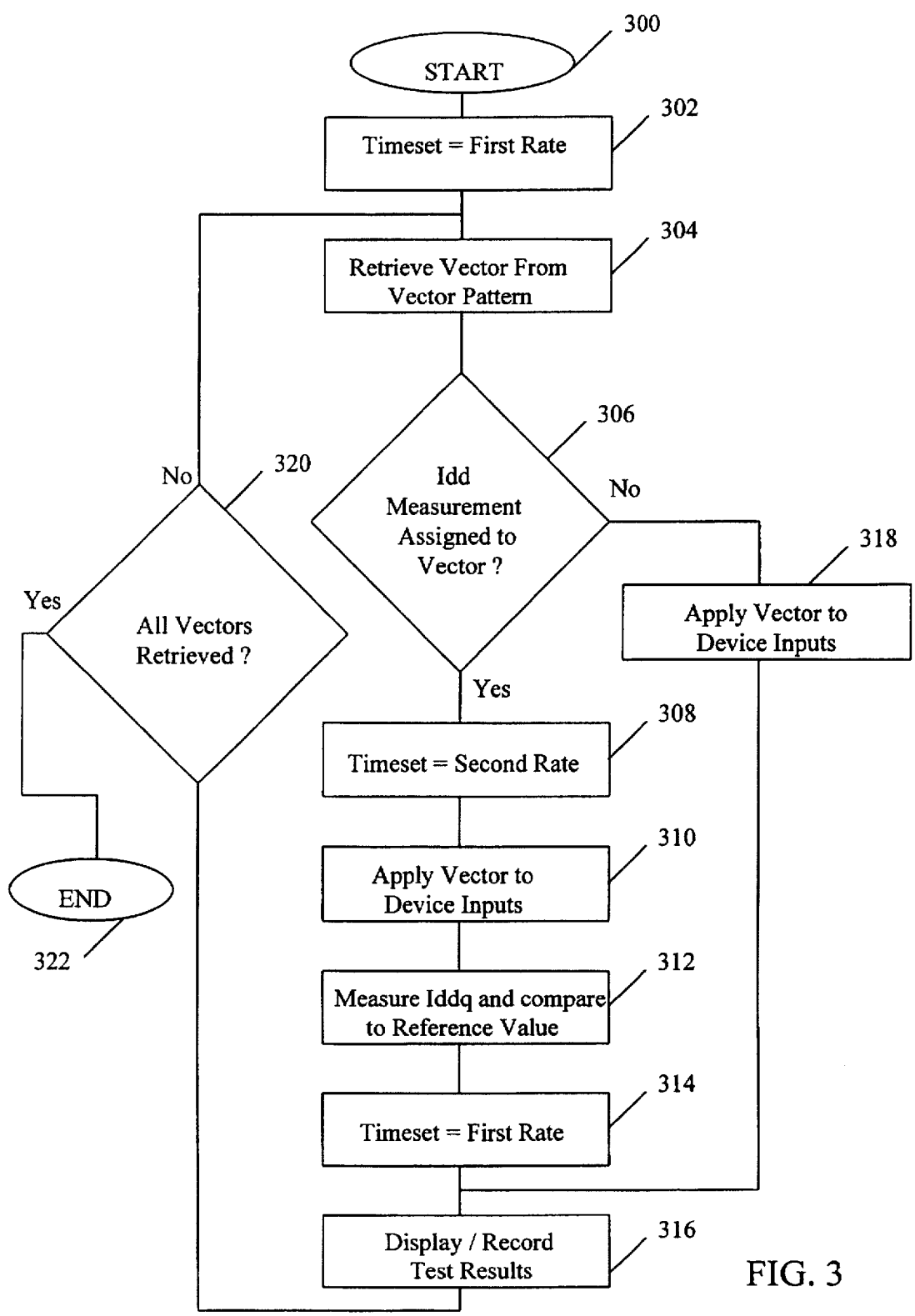
FIG. 3 is a flow chart according to still a further embodiment of the invention.

In one aspect, software running on the automatic test equipment is used to operate the timeset switching circuit. FIG. 3 shows a flow chart of software implementable steps useful with the present invention. As shown, when the device is initially started, the timeset is set to the first rate in block 302. A vector is then retrieved in step 304 from the vector pattern. Next, in step 306, the vector is tested to determine whether an IDDQ measurement is assigned to that particular vector. Those of skill in the art will recognize that there are many ways that this could be done, for example, by comparing the retrieve vector to a table of vector patterns which are associated with current measurement. Also, for another example, an additional bit could be added to the vector which would indicate that an IDDQ measurement is to be made.

When step 306 determines that an IDDQ measurement is to be made, flow continues to step 308 which sets the timeset to the second, slower rate. In step 310, the vector is then applied to the device inputs and a certain amount of time is allowed to pass until the supply current has reached its quiescent state. The amount of time required to pass will vary depending on the device, but, as an example, for high performance CMOS ASICS, it will be between about 0.01 and about 20 microseconds. After this time has passed, in step 312 the measurement of the IDDQ is performed and this value is compared to a reference value to determine whether the device is defective. After the comparison is made, the timeset is then reset to the first rate in step 314 and the display or recording of the results is performed in step 316.

By contrast, if in step 306 it is decided that no IDDQ measurement is to be made, then flow passes to step 318 and the vector is applied to the device inputs, and the results of any testing are displayed and recorded in step 316.

After step 316, flow returns to step 304 where the next vector is retrieved from the vector pattern, and steps 306 through 318 are repeated until all vectors have been retrieved as determined in step 320, and the process is ended. Of course, those of skill in the art will recognize that the above steps are simply one embodiment for performing the invention, and other steps could be substituted or added. For example, functional testing may be combined with the above embodiment in order to produce a process which provides simultaneous functional and IDDQ measurements. Still further variations within the scope and spirit of the present invention will occur to those of skill in the art.

What is claimed is:

1. A process for use with a circuit testing apparatus having a vector generator which provides a sequence of vectors to a circuit at a rate responsive to a timeset, the vectors being associateable with a quiescent current measurement, a power supply which provides quiescent current to the circuit and a current monitor which measures the current provided to the circuit, the process comprising:

providing current to the circuit being tested;

associating at least one vector in the sequence with a quiescent current measurement;

retrieving a first plurality of vectors from the sequence of vectors which are not associated with a quiescent current measurement;

setting the timeset of the vector generator so that the vector generator provides the first plurality of vectors to the circuit being tested at a first rate;

executing the first plurality of vectors with the circuit being tested whereby a predetermined state of the circuit is achieved;

retrieving the at least one vector in the sequence which is associated with a quiescent current measurement and setting the timeset to a second rate, the second rate being slower than the first rate;

providing the at least one vector to the circuit being tested at the second rate;

executing the at least one vector with the circuit being tested; and measuring the quiescent current of the circuit while the circuit being tested is executing the at least one vector.

2. A process as in claim 1 further comprising re-setting the timeset to the first rate after the quiescent current has been measured.

3. A process as in claim 1 wherein the first rate is between about 0.01 and about 100 microseconds per vector.

4. A process as in claim 1 wherein the second rate is between about 10 to about 1000 microseconds per vector.

5. A process as in claim 1 wherein associating at least one vector in the sequence with a quiescent current measurement comprises adding a bit to the at least one vector.

6. A process as in claim 1 wherein associating at least one vector in the sequence with a quiescent current measurement comprises including the at least one vector in a table of vectors which are associated with quiescent current measurements, the table being accessible by the circuit testing apparatus.

* * * * *